United States Patent [19]

Walls

[11] 4,381,340
[45] Apr. 26, 1983

[54] METHOD OF TREATING LITHOGRAPHIC PRINTING PLATES WITH 2-PROPOXYETHANOL

[75] Inventor: John E. Walls, Annandale, N.J.

[73] Assignee: American Hoechst Corporation, Somerville, N.J.

[21] Appl. No.: 298,051

[22] Filed: Aug. 31, 1981

Related U.S. Application Data

[62] Division of Ser. No. 176,363, Aug. 8, 1980, Pat. No. 4,308,340.

[51] Int. Cl.$^3$ ............................................. G03C 5/00
[52] U.S. Cl. ................................... 430/302; 430/309; 430/331
[58] Field of Search ...................... 430/309, 331, 302

[56] References Cited

U.S. PATENT DOCUMENTS 3,745,028  7/1973  Rauner .............................. 430/331
4,186,006  1/1980  Kobayashi et al. ................. 430/309

Primary Examiner—Jack P. Brammer
Attorney, Agent, or Firm—Richard S. Roberts; Leo S. Burnett

[57] ABSTRACT

A developer suitable for machine and hand processing may now be made which accomplishes the aforementioned objects which is an aqueous solution comprising 2-propoxyethanol as a detackifying agent, an adjuvant solvent, a nonionic surfactant with a hydrophile-lipophile balance over about 17, and an inorganic salt. A developer/finisher may be prepared by adding thereto a water-soluble polymeric film former which is preferably polyvinyl pyrrolidone. A suspending agent, e.g. polyethylene glycol, is added to hand processing solutions.

12 Claims, No Drawings

METHOD OF TREATING LITHOGRAPHIC PRINTING PLATES WITH 2-PROPOXYETHANOL

This is a division of application Ser. No. 176,363, filed on Aug. 8, 1980, now U.S. Pat. No. 4,308,340.

DESCRIPTION

1. Technical Field

This invention relates to developers and developer/finishers for lithographic printing plates, particularly to those of the subtractive type, i.e. those employing resin binders in their photosensitive coatings, both positive and negative working.

2. Background of Prior Art

Additive lithographic printing plates have been prepared and are still popular to this date. In this type of plate, a diazo resin is coated from an aqueous solution upon a prepared, frequently roughened and silicated aluminum sheet. To enhance the printing run length it is customary to develop the exposed plate with a developer/lacquer which simultaneously removes nonimage and deposits a resin coating upon the image portions of the plate. The resin coating, or "cap" permits run longer run lengths than possible with only the unprotected diazo image.

To obtain improvements in coating life, uniformity of product and standardization of exposure speed, newer generations of presensitized plates were introduced which either overcoated the entire diazo layer with a resin layer or combined the resin with the sensitizer in the photosensitive coating. Sensitizers, binders and printing plates employing quinone diazides and aromatic diazonium compounds are described in U.S. Pat. Nos. 3,175,906; 3,046,118; 2,063,631; 2,667,415; 3,867,147 and 3,679,419.

Greater uniformity of plates were obtained along with longer runs lengths. However, sporadic blemishes occur in these plates due to development with common solvents as components of the developer solutions. Particularly in negative working plates, nonimage areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image in the printed sheet.

Positive working plates such as those based upon quinone diazides with Novalak resin binders are not known to suffer from the redeposit problem. Known developers for negative working printing plates employ solvents and surfactants in solution. Exemplary are U.S. Pat. Nos. 4,130,425; 3,954,472. The latter employs polyvinyl pyrrolidone as a film former. Other examples include U.S. Pat. Nos. 3,091,533; 3,891,439. Finisher compositions are described in U.S. Pat. No. 4,213,887.

Efforts have been made to prepare developer/finishers which, as the name suggests, develop and prepare a plate for the printing press or for storage in a single operation. This objective has become particularly desirable with the advent of processing machines. Examples of such solutions include U.S. Pat. No. 2,754,279 and German Offenlegungsschrift No. 2,216,419. The latter two patents describe two-phase developer/finishers.

In the use of both developers and developer/finishers in machines, problems arise in the etching and plating of the process as a result of the ingredients of the developer or developer/finisher which form galvanic cells with the disimilar metals and alloys of the machine. A further problem area is in the use of volatile solvents in the processing solution selected so as to prevent tackiness in the image by permitting rapid evaporation. Tackiness adversely effects press performance.

Salts are added to regulate pH and to contribute to hydrophilizing action on the background.

Low boiling solvents result in health and explosion danger due to the high concentration of organic vapors in plants where processing machinery is used. Further, the rapid rate of evaporation requires excessive replenishment and decreases the length of time a processing machine can be used for its intended purposes.

Another useful component of processing solutions are surfactants. Anionic, nonionic, and cationic surfactants have long been employed, particularly with emulsions.

It is an object of this invention to provide a developer and developer/finisher for both machine and hand development of lithographic printing plates having resin binders in their photosensitive coatings, which will enable the operator to prepare a plate free from objectionable redeposit.

It is a further object to provide processing solutions for machine development which will sharply minimize volatilization of organic solvent vapors and thereby improve working conditions and simultaneously reduce the need for replenishment in the machine.

It is another object of this invention to provide processing solutions which combine the above objects with good hydrophilization of the nonimage areas and oleophilization of the image areas.

These and other objects will become apparent in the detailed description of the preferred embodiment.

BRIEF SUMMARY OF THE INVENTION

A developer suitable for machine and hand processing may now be made which accomplishes the aforementioned objects which is an aqueous solution comprising 2-propoxyethanol as a detackifying agent, an adjuvant solvent, a nonionic surfactant with a hydrophile-lipophile balance over about 17, and an inorganic salt. A developer/finisher may be prepared by adding thereto a water-soluble polymeric film former which is preferably polyvinyl pyrrolidone. A suspending agent, e.g. polyethylene glycol, is added to hand processing solutions.

DETAILED DESCRIPTION OF THE INVENTION

Harmful effects due to use of solvents may be avoided by the addition to the developer of a detackifying agent, an agent which:

1. is inert, compatible, and miscible with all components of a developer or developer/finisher formulation
2. is a liquid which is a non-solvent for the components of the photosensitive composition, and thus does not soften, or tackify the resin components, nor dissolve the sensitizer
3. is chemically inert within a temperature range encountered in storage, 0° F. to 140° F.

4. permits penetration or assists in the penetration of the nonimage film so that it may detach from the support
5. tolerates higher levels of salts and film formers in developers at higher temperatures without causing undesirable phasing.

A preferred detackifying agent is 2-propoxyethanol, which therefore functions in both the developer and developer/finisher of this invention.

A further function of 2-propoxyethanol which depends upon its relatively high boiling point of 152° C. (vapor pressure=0.7 mm of mercury), is to lower the vapor pressure of the adjuvant solvent required in the developer or developer/finisher composition. The adjuvant solvent provides combined penetration of the photosensitive coating layer and rapid evaporation.

In use, 2-propoxyethanol is present at about 5% to about 50% by weight, based on the total composition. However, a range of between about 10% to about 25% by weight is preferred.

As a result of its detackifying capability, the overall composition containing 2-propoxyethanol provides a harder, tougher, drier image area which is conductive to longer printing runs than has been hitherto possible when the same printing plate has been developed with conventional solvent type of developers. The toxicity of 2-propoxyethanol is much lower than that of other commonly used solvents. It is rated "non-irritating" to rabbit skin. Most other solvents are rated as "minimally" or "slightly" iritating. The full scale of rating follows:

| Extremely irritating | Slightly irritating |
| Generally irritating | Minimally irritating |
| Moderately irritating | Non-irritating |
| Mildly irritating | |

Another advantage of the lowered vapor pressure of the developer or developer/finisher composition, particularly in machine application, is a sharp reduction in need for replenishment. Typically, a fivefold increase in area processed with the solution of the invention is experienced compared to prior art solutions due to the poor solvency of propoxyethanol for diazo from nonimage areas. This, in turn, prevents reapplication of unwanted diazo to the finished plate.

The adjuvant developer solvent, while not essential for hand development and machine development, does speed both development and evaporation of the residual developer film from the printing plate and in this regard is particularly desirable for machine development to provide a dry plate as it exits the machine. Useful adjuvant developers include: n-propanol, isopropanol, methanol, ethanol, butanols, ethylene glycol monomethyl ether and acetate thereof, ethylene glycol mono ethyl ether, and acetate thereof, ethylene glycol isopropyl ether and acetate and phenoxy ethanol, diethylene glycol monoacetate, and di-acetate, propoxy methyl ether, benzyl alcohol, propoxy isopropyl ether and butyrolactone, propoxy n-propyl ether, and the like.

Of the foregoing, n-propanol, isopropanol and propoxy isopropyl ether, butyrolactone and phenoxyethanol are preferred. Obviously, higher molecular weight or higher boiling point adjuvant solvents will not assist as effectively in contributing faster drying times, but nevertheless, should have compatability and will improve development speed without adding risk of redeposit by adding excessive solvency to the coating. Adjuvant solvents may be used in an amount up to 25% by weight of the total composition. However, it is preferrable that they be present in an amount of about 5% to about 15% by weight.

A properly chosen surfactant will contribute desirable characteristics to the developer or developer/finisher. Although all components interact and should be tested in combination, it has been found that a satisfactory surfactant can contribute to a clean background, smooth film formation, low foaming, a high cloud point, quick release from the image, and possibly, even assist in enhancing the oleophilicity of the image. In addition, it will provide proper surface tension and, of course, be compatible with other ingredients, so as not to create separation. In addition, it will have no offensive or toxic effects.

Nonionic surfactants are, in general, the most satisfactory. The hydrophile-lipophile balance (HLB) concept is widely used to characterize individual surfactants numerically, based upon their relative balance of hydrophilic and oleophilic groups. The HLB concept is valuable in helping to select the proper surfactant from among the class of nonionics. Although performance tests of complete developer and developer/finisher compositions must be made, nevertheless the HLB is a valuable guide in selection of individual surfactants or their blends.

Surfactants contribute to the penetration of the developer or developer/finisher composition through the photosensitive coating layer. Nonionic surfactants are preferred, particularly those which have a very high hydrophilic-lipophilic balance (HLB) due to ethoxylation. This results in the absence of cloud point which in turn contributes no tendency to undesirable phasing of the processing solution. Preferred are nonionics with an HLB of greater than about 17. There is no upper limit. A general formula of useful, preferred surfactants follows:

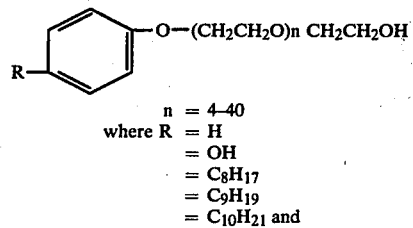

$$n = 4\text{--}40$$
where $R = H$
$= OH$
$= C_8H_{17}$
$= C_9H_{19}$
$= C_{10}H_{21}$ and

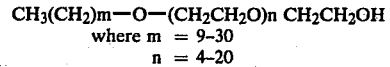

where $m = 9\text{--}30$
$n = 4\text{--}20$

Also useful are amphoteric surfactants which are betaines.

Surfactants may be present in an amount of about 0.05% to about 3%. However, it is preferred that they be present from 0.1% to 1.5% by weight of the overall composition.

Salts are added to regulate pH and to contribute to the hydrophilizing action on the background. Suitable salts include sodium nitrate, sodium sulfate, calcium nitrate, magnesium nitrate, magnesium sulfate, sodium phosphate, ammonium phosphate, ammonium nitrate, ammonium sulfate, sodium acetate, potassium tartrate, mono-, and di- and trisodium phosphates and the corresponding potassium phosphates, and the like, as long as solutions of these salts do not corrode the plate. Of these, the various phosphate salts are preferred.

Salt for developers may be used in a range from about 1% to about 16% with about 6% to about 12% preferred. For developer/finishers a range of about 2% to about 18% may be used with about 8% to about 14% preferred.

Polyvinyl pyrrolidone has a dual function in the processing solutions of this invention. In both the developer and developer/finisher it serves to encapsulate the removed resin so that it does not redeposit or coalesce with other removed particles. Additionally, it serves as a film former in the finishing action of the developer/finisher. A desirable film former will now lower the oleophilicity of the image. Polyvinyl pyrrolidone is the preferred film former and encapsulation agent. Polyvinyl pyrrolidones ranging in molecular weight from about 5,000 to about 100,000 are preferred.

Other useful film formers include: copolymers of maleic anhydride and methyl vinyl ether, isopropyl cellulose, hydroxy isopropyl cellulose, carboxymethyl cellulose, carboxy methyl hydroxy ethyl cellulose, gum arabic, dextrins, and the like.

For hand processing a glycol may be incorporated with the developer or developer/finisher to help suspend removed particles and provide additional insurance against redeposit. Propylene glycol or polyethylene glycol (200) are preferred.

Although not essential to the effectiveness of a freshly made finisher, according to this invention, an antimicrobial agent or bacteriostat is desirable to aid in its preservation. Numerous phenols and phenol derivatives are available on the market for use as bacteriorstats and fungistats. Compositions containing these at the level of a few tenths of a percent or even lower are sufficient for effective retardation of spoilage.

To test the developer or developer/finishers of this invention previously exposed plates are developed. If a machine processor is used, the temperature range of about 60° to 95° F. may be used, but the processing solution is preferably held at about 85° F. If hand processing is used this may take place at room temperature, i.e. between 68° and 74° F. What is observed is that in contrast to developing with conventional developers which use common solvents to aid the penetration of the photosensitive coatings, plates obtained when processing with the solutions of the present invention are free of redeposit. Further, in printing trials comparing these plates, significantly longer runs are obtained. These effects will be shown below in the section dealing with examples. Efficacy of the finisher action of the developer/finishers of this invention is tested by procedures outlined in U.S. Pat. No. 4,213,887.

Previously exposed and developed plates are hand treated with experimental developer/finisher solutions, and then baked at 100° C. for 15 minutes. After the plate is cooled, it is dry-inked with heavy rub-up ink. The ink is then water washed and the plate observed for lithographic properties. Similarly, the hydrophilic polymers are tested, first for cold watersolubility, and then by application as a film to a lithographic plate. Even after heating in an oven at 70° C. for 10 minutes, the film is readily removed from the image with cold water washing.

Complete developer and developer/finisher formulations must retain the oleophilicity of the image, so that a quick and total rollup is attained. At the same time, the background must be protected during storage prior to printing so as to retain total hydrophilicity. Upon rollup, the plate must have the ability to release ink that may have been applied through handling or because of ink that is present when the ink form rollers are dropped without adequate dampening.

Complete formulations are tested by various techniques. One is to store finished plates and observe the rollup. Accelerated tests are performed by baking at 70° C., 100° C., and 120° C. Other plates were stored in the refrigerator and at room temperature. All these plates are tested by:
1. Dry inking and rebaking the plate and rinsing.
2. Dry inking and rinsing immediately.
3. Rinsing the plate, dry ink, then rinse again.
4. Rinse the plate and wet ink.

In all cases, after the test, the plate must have a clean background and a totally oleophilic image.

The compositions of the present invention are particularly useful for lithographic printing plates having coatings which contain diazo salts and 1,2-diazo-naphthoquinone sulfoesters and polymers such as polyvinyl formal and novalak type phenolic resins. Typical plates which may be processed with the plate finishers of this invention are in the ENCO ® N-25, N-50, N-100, N-200 and N-2 Negative-Acting Plates and the ENCO ® PA-200 Series Positive-Acting Plates, products of Azoplate, Division of American Hoechst Corporation. Also processable are the Polychrome DGN, and the "S", "K", and Tartan ® plates of the Minnesota Mining and Manufacturing Company. All these are subtractive plates. In addition to negative and positive working subtractive lithographic plates, tests were successfully conducted on wipe-on substrates, as detailed in Examples below.

The efficiency of finishing action, in every case, was tested by several rigorous methods designed to accentuate any inherent weaknesses of the formulation. The final test was to place the treated plates on a printing press and run several thousand acceptable copies. Particular emphasis is placed upon the speed and totality of the image on roll up.

One method was to process a developed plate with the solution to be tested, either by hand or machine. Half of the plate was dry-inked with any conventional heavy rub-up ink and buffed to a thin film. The other half of the plate was untreated. The entire plate was baked at 100° C. for 15 minutes. After baking and upon the plate being cooled to room temperature, the side that was previously ink was wiped with a damp pad. The untreated side was inked with a damp pad. In both cases, an acceptable finisher would prevent any ink from adhering to the background while at the same time not preventing the image from being fully ink receptive.

The following examples are illustrative of the invention:

EXAMPLE 1

20.0 l. of a developer/finisher solution was prepared by mixing the following ingredients:

| Ingredients | Amount |
| --- | --- |
| n-propanol | 3,342 ml |
| 2-propoxyethanol | 1,757 ml |
| $(NH_4)_2SO_3$(50% aq. sol.) | 840 gr |
| nonionic surfactant* | 90 gr |
| tapioca dextrin | 910 gr |
| $Na_2SO_4$ | 300 gr |
| water | 14,456 ml |

*nonylphenoxy polyoxyethylene ethanol (4.0 moles EO) Hydrophile-lipophile balance (HLB) is 16.4.

The solution was placed in a processing machine that develops both sides of a plate at the same time. There is no rinse stage, so that the thin film that remains on the plate must serve as a finisher. The processor is sold as the N-221 Processor by Azoplate, Division of American Hoechst Corporation.

The temperature in the reservior which contains the developer/finisher is maintained at 85° F. Plates that are nonanodized or anodized and that are coated with a light sensitive composition comprising a polyvinyl formal binder, pigment and a light sensitive diazonium compound, are processed with the previously described developer/finisher solution. Such plates are sold by Azoplate, Division of American Hoechst Corporation, as the ENCO ® N-25, N-50, N-100 and N-200 plates.

Processing many N-50 plates with this developer finisher, no redeposit was observed at any time. Further, when plates made with this system were aged at room temperature and elevated temperatures for extended periods of time, they retained hydrophilicity in the background and oleophilicity in the image area. This determination is made by dry inking the subject plate with any common rub-up ink in a totally dry fashion. Water is applied with light rubbing.

In essentially all cases using the various finishers available on the market, such abusive treatment would result in a scummed background and possibly in some instances, blinding of the image.

In no instance did any of the test plates produced show blinding under any of the test procedures. Further, when a plate was placed on the press, acceptable copy was obtained in six impressions after the ink form rolls were dropped.

EXAMPLE 2

A DGN plate (presensitized negative plate, product of Polychrome Corporation) was processed by hand using the developer/finisher described in Example 1. The plate was exposed to 24 units on a high pressure mercury vapor Berkey-Ascor vacuum frame. After exposure, the plate was developed with the developer/finisher and finished with the same solution. The background coating was removed easily with no evidence of redeposit. In addition, application of the rigorous inking test showed a hydrophilic background not prone to scumming.

EXAMPLE 3

A kilogram of commercial developer/finisher solution containing no propoxyethanol was made as follows:

| Ingredients | Amount |
| --- | --- |
| n-propanol | 201 ml |
| tapioca dextrin | 46 gr |
| magnesium citrate | 53 gr |
| nonionic surfactant* | 6 gr |
| trisodium phosphate | 8 gr |
| water | 725 ml |

*polyoxyethylene monosorbitan oleate. HLB = 18

An N-50 plate as described in Example 1 was exposed for 26 BAU (Berkey-Ascor Units) and developed with the above solution. The particles coating removed from the background by the action of the developer became very tacky and began to coalesce. These aggregates began to adhere to the image. Attempts to remove this redeposited material were not always successful, but when removed, the underlying image was removed as well. After water rinsing, a new portion of developer/finisher solution was applied to the plate as a finisher. The background showed preservation of nonimage hydrophilicity.

EXAMPLE 4

A developer was prepared as follows:

| Ingredients | Amount |
| --- | --- |
| γ-butyrolactone | 1,219.3 ml |
| n-propanol | 1,062.1 ml |
| MgSO$_4$ | 1,125.0 gr |
| nonionic surfactant* | 75.0 gr |
| water | 11,550.0 ml |

*tridecylalcohol polyoxyethylene ethanol (12 moles EO) HLB = 18.

The developer solution was placed in the N-221 processor described in Example 1. Many N-50, N-200, and Tartan 150 ® plates described in the same example were processed. In all instances, the background was clean and free of all non-insolubilized coating. The removed coating redepositied severely upon the image. Not only did the particulate matter form globular redeposits, but smearing was uncontrollable. The developed plate was rinsed and finished by buffing dry with the developer solution. When dry inked, the background of the plate was severely scummed in all instances due to the absence of film former and accompanying salts.

EXAMPLE 5

A batch of developer/finisher was prepared for use in the processor at 85° F. as follows:

| Ingredients | Amount |
| --- | --- |
| 2-propoxyethanol | 2,970 ml |
| n-propanol | 1,430 ml |
| MgSO$_4$ | 2,000 gr |
| NaH$_2$PO$_4$ | 200 gr |
| nonionic surfactant* | 100 gr |
| PVP-(25% aq. sol.)M.W. = 10,000 | 1,200 gr |
| water | 2,100 ml |

*isooctyl phenoxy polyoxyethylene ethanol (40 moles EO) HLB >20.

The processing unit described in Example 1 was charged with the solution and the temperature elevated to 85° F. Several thousand square feet of N-50 plates were processed satisfactorily. When developability declined the solution was replenished with propoxyethanol, n-propanol and water to return the solution to the original ratio. Again many thousands of square feet were satisfactorily processed. This procedure was repeated six times.

After concluding the test, many more thousands of square feet were developed before total exhaustion than was developed with the developer in Example 4. Further, in no instance did one case of redeposit occur. When subjected to aging tests followed by dry inking, none of the plates showed any signs of scumming and/or blinding.

EXAMPLE 6

A developer for hand processing negative working plates was prepared according to the following formula:

| Ingredients | Amount |
|---|---|
| γ-butyrolactone | 70.0 ml |
| benzyl alcohol | 33.5 ml |
| (NH4)2SO3 (50% aq. sol.) | 43.0 gr |
| nonionic surfactant* | 4.0 gr |
| NH4NO3 | 15.0 gr |
| glycerin | 22.0 gr |
| tapioca dextrin | 30.0 gr |
| water | 771.0 gr |

*decyl alcohol polyoxyethylene ethanol (4 moles EO) HLB = 14.5

A series of N-25, N-50 and N-200 plates described in Example 1 was developed with the above solution. The background coating was easily removed. Although much reduced due to the inclusion of glycerin and dextrin, redeposit eventually occurred. Once attached to the image, its removal was impossible without damage to the integrity of the image area.

Representative samples of each of the three types of plates was treated with the above solution now used as a finisher. In no case when dry inked, whether baked or not-baked, was there any blinding of the image or scumming of the background.

EXAMPLE 7

A hand developer was prepared as follows:

| Ingredients | Amounts |
|---|---|
| 2-propoxyethanol | 162.7 ml |
| benzyl alcohol | 41.1 ml |
| magnesium citrate | 27.0 ml |
| K2SO4 | 12.5 ml |
| PVP (25% aq. sol.) M.W. = 10,000 | 53.2 ml |
| nonionic surfactant* | 6.0 ml |
| propylene glycol | 9.5 ml |
| water | 737.7 ml |

*decylphenoxy polyoxyethylene ethanol (6 moles EO) HLB = 17.2

An ENCO® N-50 plate as well as a Tartan 30® (product of Minnesota Mining and Manufacturing Company, St. Paul, Minn.) was exposed for 24 BAU and developed with the above developer/finisher. The background coating was removed easily and with no hint of redeposit in either case. The removed particles were finely dispersed and remained suspended throughout development.

After development, the solution was applied to each plate and buffed dry as a finisher. Upon dry inking, no trace of scumming or blinding was observed on either plate.

EXAMPLE 8

A hand developer/finisher was prepared according to the following formula:

| Ingredients | Amount |
|---|---|
| phenoxy ethanol | 34.3 ml |
| propoxy n-propyl ether | 81.3 ml |
| (NH4)2SO3 (50% aq. sol.) | 20.8 gr |
| ethylene glycol | 11.9 gr |
| tapioca dextrin | 25.2 gr |
| Zn(NO3)2 | 9.8 gr |
| nonionic surfactant* | 3.0 gr |
| water | 515.0 ml |

*isooctyl phenoxy polyoxyethylene ethanol (4 moles EO) HLB = 16.4

The developer was tried on the N-50 and N-25 plates described in Example 1. The background was removed easily, thus providing a clean background. The coating thereby removed was smeared onto the image with the minimum amount of pressure. The image was totally unacceptable due to severe redeposit.

Upon washing the plate as best as possible, the plates were treated with the solution as a finisher. After aging and subsequent dry inking of the surface, water washing fully removed the ink from the nonimage area while providing a fully inked image.

EXAMPLE 9

A hand developer/finisher was made according to the following formula:

| Ingredients | Amount |
|---|---|
| 2-propoxyethanol | 241.60 ml |
| n-propanol | 198.40 ml |
| MgSO4 | 120.00 gr |
| NaH2PO4 | 15.00 gr |
| nonionic surfactant* | 11.25 gr |
| PVP (25% aq. sol.) | 90.00 gr |
| Carbowax 200 | 11.25 gr |
| water | 870.00 gr |

*isooctyl phenoxy ethylene ethanol (40 moles EO)

An ENCO® and N-50 as well as a 3M Tartan 150® were exposed for 24 BAU and developed with the above solution. All three plates developed with ease. No redeposit occurred nor could be made to occur.

The solution was applied as a finisher to all three plates after which they were dry inked to test its efficacy as a finisher. All plates had a hydrophilic surface by virtue of the ease and totality with which the ink was removed. The image area was fully inked.

EXAMPLE 10

The developer/finisher of Example 8 was diluted to 60% of its original concentration with water. ENCO® P-30 and P-150 plates (positive plates manufactured and sold by Azoplate, Division of American Hoechst) were properly exposed through a positive test flat. They were then developed with the diluted developer/finisher. The background began to remove easily without any redeposit. Shortly after beginning development, the image began to dissolve away. In both cases, the plates were useless and had to be discarded.

EXAMPLE 11

In contrast to Example 10, the developer of Example 9 was diluted to 70% of its concentration with water. Again P-30 and P-150 plates were properly exposed through a positive test flat. They were then subjected to development with the developer/finisher. In both instances, the background was fully removed with ease and without any redeposit for adverse affect upon the image.

The solution was applied to each plate and buffed dry as a finisher. When subjected to the dry inking test, both exhibited a clean background and fully inked image area.

EXAMPLE 12

A developer was prepared according to the following formula:

| Ingredients | Amount |
|---|---|
| isopropanol | 112.6 ml |
| ethylene glycol monobutyl ether | 14.9 ml |

| Ingredients | Amount |
| --- | --- |
| nonionic surfactant | 4.0 gr |
| tetrapotassium phosphate | 4.8 gr |
| water | 86.6 ml |

The developer was used to process N-50, Tartan 30 ® and Polychrome DGN plates that had been properly exposed through a negative test flat. The background removed very easily but was dissolved rather than physically removed. In addition, the image area of all three plates was weakened as was visibly obvious by the leaching of pigment from the image.

N-50 plates were made with this developer and the one from Example 9 in exactly the same fashion. They were placed on a conventional sheet fed printing press and run until image breakdown. The plate processed with the developing solution of Example 9 ran 12% longer than with the developer of this example.

EXAMPLE 13

The formula of Example 5 was prepared as outlined except for the omission of PVP and $NaH_2PO_4$. The difference was made up with water. A N-200 and Tartan 150 ® were developed in a processor containing this developer. The background was fully desensitized and developed. No redeposit occurred on either plate.

When tested as a finisher, the lack of the film former and salt had a visible effect. Both plates scummed irreversibly although the image was entirely oleophilic. However, when a finisher was used, excellent results were obtained.

EXAMPLE 14

The formula of Example 7 was prepared as outlined except that the PVP and $K_2SO_4$ was deleted from the formula. The difference lost was made up with water. N-50 and Polychrome DGN were developed by hand with this developer. The background was fully desensitized and developed. No redeposit occurred on either plate, even when an effort was made to induce it.

The same solution was applied as a finisher and buffed dry on both plates. When dry inked, each exhibited severe scumming of the background. However, when a finisher was used, excellent results were obtained.

EXAMPLE 15

A slurry grained aluminum plate was treated thermally with a hot solution of polyvinyl phosphonic acid. In like manner a similarly grained plate was thermally treated with a hot solution of sodium silicate. Both were whirl coated with a 3.0% aqueous solution of the condensation product of P-diazodiphenylamine and formaldehyde precipitated as the $ZnCl_2$ salt.

Both plates were given the proper exposure so as to result in a solid 6 on a 21 step Staffer Step Wedge. Each plate was developed with the developer/finisher of Example 7.

The background was fully desensitized on both plates. When dry inked, each had a totally oleophilic image and a clean background.

Two plates identical to those described above were exposed and developed with a conventional lacquer developer such as Jet Black Developer made by Western Litho. After proper development the plates were rinsed and finished with the developer/finisher of Example 7. In doing so, the resin deposited on the image by the lacquer was not affected by the solution. Further, exposure to the rigorous dry inking test yielded a clean background.

It is to be understood that various changes in the details, steps, materials and arrangements of parts, which have been herein described and illustrated in order to explain the nature of the invention, may be made by those skilled in the art within the principle and scope of the invention as defined in the appended claims and their equivalents.

What is claimed is:

1. The method of developing a lithographic printing plate having resin binders in photosensitive coatings adherent thereupon, comprising treating said printing plate with a solution comprising 2-propoxyethanol as a detackifying agent, to remove the nonimage portions.

2. The method of claim 1, wherein said solution comprises
   (a) 2-propoxyethanol as a detackifying agent,
   (b) a nonionic surfactant having an hydrophile-lipophile balance greater than about 17; and
   (c) an inorganic salt.

3. The method of claim 2, wherein said solution further comprises an adjuvant organic solvent.

4. The method of claim 3, wherein said adjuvant organic solvent has a vapor pressure greater than about 1 mm of mercury.

5. The method of claim 4, wherein the adjuvant organic solvent is selected from the class consisting of n-propanol, isopropanol, and propoxy isopropyl ether.

6. The method of claim 4, wherein the solution further comprises a polyethylene glycol having an average molecular weight not exceeding about 800.

7. A method for simultaneously developing and finishing a lithographic printing plate having resin binders in photosensitive coatings adherent thereupon, comprising treating said printing plate with an aqueous solution comprising a detackifying agent comprising 2-propoxyethanol to remove the nonimage protion and impart oleophilicity to the image and hydrophilicity to the nonimage portions of said printing plate.

8. The method of claim 7, wherein said solution comprises
   (a) 2-propoxyethanol as a detackifying agent,
   (b) a nonionic surfactant having an hydrophile-lipophile balance greater than about 17,
   (c) an inorganic salt; and
   (d) a water soluble polymeric film former.

9. The method of claim 8, wherein said solution further comprises an adjuvant organic solvent.

10. The method of claim 9, wherein the adjuvant solvent is selected from the class consisting of n-propanol, isopropanol, and propoxy isopropyl ether.

11. The method of claim 8, wherein said water soluble polymeric film former is a polyvinyl pyrrolidone having a molecular wieght between about 5,000 and about 100,000.

12. The method of claim 8, wherein said solution further comprises polyethylene glycol having an average molecular weight not exceeding about 800.

* * * * *